(12) United States Patent
Roitshtein (10) Patent No.: US 9,195,622 B1
(45) Date of Patent: Nov. 24, 2015

(54) MULTI-PORT MEMORY THAT SUPPORTS MULTIPLE SIMULTANEOUS WRITE OPERATIONS

(71) Applicant: MARVELL INTERNATIONAL LTD., Hamilton (BM)

(72) Inventor: Amir Roitshtein, Holon (IL)

(73) Assignee: MARVELL WORLD TRADE LTD., St. Michael (BB)

( * ) Notice: Subject to any disclaimer, the term of this patent is extended or adjusted under 35 U.S.C. 154(b) by 309 days.

(21) Appl. No.: 13/939,973

(22) Filed: Jul. 11, 2013

Related U.S. Application Data

(60) Provisional application No. 61/670,349, filed on Jul. 11, 2012.

(51) Int. Cl.
*G06F 13/16* (2006.01)
*G06F 12/08* (2006.01)

(52) U.S. Cl.
CPC ........ *G06F 13/1663* (2013.01); *G06F 12/0853* (2013.01)

(58) Field of Classification Search
CPC .................................................. G06F 12/0853
See application file for complete search history.

(56) References Cited

U.S. PATENT DOCUMENTS

| 4,870,643 | A | 9/1989 | Bultman et al. |
| 5,414,455 | A | 5/1995 | Hooper et al. |
| 5,508,732 | A | 4/1996 | Bottomley et al. |
| 5,581,479 | A | 12/1996 | McLaughlin et al. |
| 5,636,139 | A | 6/1997 | McLaughlin et al. |
| 6,397,324 | B1 | 5/2002 | Barry et al. |
| 7,421,559 | B1 * | 9/2008 | Yadav ........................... 711/169 |
| 7,437,472 | B2 | 10/2008 | Rose |
| 7,451,467 | B2 | 11/2008 | Carver et al. |
| 8,358,651 | B1 | 1/2013 | Kadosh et al. |
| 2003/0046477 | A1 | 3/2003 | Jeddeloh |
| 2003/0120861 | A1 | 6/2003 | Calle et al. |
| 2012/0127818 | A1 | 5/2012 | Levy et al. |

FOREIGN PATENT DOCUMENTS

WO WO-2010/071655 A1 6/2010

* cited by examiner

*Primary Examiner* — Kalpit Parikh (57) ABSTRACT

It is determined whether more than one half of a plurality of data blocks are addressed to a same primary memory bank in a plurality of memory banks. If not more than one half of the data blocks in the plurality of data blocks are addressed to the same primary memory bank, the plurality of data blocks are written to appropriate ones of the primary memory banks in a single clock cycle. If more than one half of the data blocks are addressed to the same primary memory bank, (i) a subset of the data blocks addressed to the same primary memory bank are written to the same primary memory bank, and (ii) one or more remaining data blocks of the data blocks addressed to the same primary memory bank are written to an additional memory bank.

28 Claims, 7 Drawing Sheets

FIG. 6

MULTI-PORT MEMORY THAT SUPPORTS MULTIPLE SIMULTANEOUS WRITE OPERATIONS

CROSS-REFERENCE TO RELATED APPLICATION

This disclosure claims the benefit of U.S. Provisional Patent Application No. 61/670,349, filed Jul. 11, 2012, entitled "Write Capacity Increase," the disclosure of which is hereby expressly incorporated herein by reference in its entirety.

FIELD OF THE DISCLOSURE

The present disclosure relates generally to memory device and, more particularly, to multi-port memory devices supporting multiple concurrent read and/or write operations.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Conventional memory devices, such as single port memory device capable of supporting only a single memory operation, such as write operation, in a single clock cycle often suffer from limited write memory capacity that may be insufficient for some applications. For example, in the context of network switching, such memory devices may be employed by a switching device for buffering packets during processing of the packets by the switching device, or for storing information (e.g., metering data) determined for packets during processing of the packets by the network device. In such applications, memory devices require sufficient write capacity to be able to operate at the wire speed rate of network ports. Increasing wire speed rates, therefore, require memories with increasingly high write capacities. However, conventional methods of increasing write capacity of a memory device are inefficient and require significant increases in area occupied by the memory device and/or power consumed by the memory device. Further, the conventional methods are not easily scalable for higher memory capacities.

SUMMARY

In one embodiment, a method of performing memory operations, includes receiving a plurality of data blocks to be written to one or more memory banks among a plurality of memory banks, including receiving at least a first data block and a second data block, the plurality of memory banks including one or more primary memory banks and at least one additional memory bank; determining whether (i) the first data block and the second data block are addressed to respective different primary memory banks among the plurality of memory banks or (ii) the first data block and the second data block are both addressed to of the same primary memory bank in the plurality of memory banks; in response to determining that the first data block and the second data block are addressed to respective different primary memory banks among the plurality of memory banks, writing, in a single clock cycle, the first data block and the second data block to the respective different primary memory banks; and in response to determining that the first data block and the second data block are both addressed to the same primary memory bank in the plurality of memory banks, writing, in the single clock cycle, the first data block to the same primary memory bank and the second data block to the additional memory bank.

In another embodiment, a memory device comprises a plurality of memory banks for storing data, including a plurality of primary memory banks and one or more additional memory banks; two or more ports configured to receive respective two or more data blocks; and a memory controller coupled to the two or more ports. The memory controller configured to: receive, via the two or more ports, a plurality of data blocks to be written to the plurality of memory banks, including at least a first data block and a second data block; determine whether (i) the first data block and the second data block are addressed to respective different primary memory banks among the plurality of memory banks or (ii) the first data block and the second data block are both addressed to a same primary memory bank in the plurality of memory banks; in response to determining that the first data block and the second data block are addressed to respective different primary memory banks among the plurality of memory banks, write, in a single clock cycle, the first data block and the second data block to the respective different primary memory banks; and in response to determining that the first data block and the second data block are addressed to the same primary memory bank, write, in the single clock cycle, the first data block to the same primary memory bank and the second data block to the additional memory bank.

In another embodiment, a method of performing memory operations includes receiving a plurality of data blocks to be written to one or more memory banks among a plurality of memory banks including a plurality of primary memory banks and an additional memory bank; determining whether more than one half of the data blocks in the plurality of data blocks are addressed to a same primary memory bank in the plurality of memory banks; in response to determining that not more than one half of the data blocks in the plurality of data blocks are addressed to the same primary memory bank, writing, in a single clock cycle, the plurality of data blocks to appropriate ones of the primary memory banks; and in response to determining that more than one half of the data blocks in the plurality of data blocks are addressed to the same primary memory bank, (i) writing to the same primary memory bank, in the single clock cycle, a subset of the data blocks addressed to the same primary memory bank, wherein a number of data blocks in the subset is not more than one half of the data blocks in the plurality of data blocks, (ii) writing to the additional primary memory bank, in the single clock cycle, one or more remaining data blocks of the data blocks addressed to the same primary memory bank, and (iii) writing to one or more other primary memory banks, in the single clock cycle, data blocks in the plurality of data blocks not addressed to the same primary memory bank.

In yet another embodiment, a memory device comprises a plurality of memory banks for storing data, including a plurality of primary memory banks and one or more additional memory banks; a plurality of ports configured to receive respective data blocks in a plurality of data blocks; and a memory controller coupled to the plurality of ports. The memory controller is configured to: receive, via the plurality of ports, the plurality of data blocks to be written to one or more memory banks among a plurality of memory banks, determine whether more than one half of the data blocks in the plurality of data blocks are addressed to a same primary memory bank in the plurality of memory banks, in response to determining that not more than one half of the data blocks in the plurality of data blocks are addressed to the same primary memory bank, write, in a single clock cycle, the plurality of data blocks to appropriate ones of the primary memory banks, and in response to determining that more than one half of the data blocks in the plurality of data blocks are addressed to the same primary memory bank, (i) write to the same primary memory bank, in the single clock cycle, a subset of the data blocks addressed to the same primary memory bank, wherein a number of data blocks in the subset is not more than one half of the data blocks in the plurality of data blocks, (ii) write to the additional primary memory bank, in the single clock cycle, one or more remaining data blocks of the data blocks addressed to the same primary memory bank, and (iii) write to one or more other primary memory banks, in the single clock cycle, data blocks in the plurality of data blocks not addressed to the same primary memory bank.

DETAILED DESCRIPTION

Examples of efficient and scalable high speed multi-port memory devices and methods are described herein. For explanatory purposes, example memory devices are described in the context of a switch for processing packets transmitted over a communication network. It is noted, in light of the disclosure and teachings herein, that similar methods and apparatus for high speed multi-port memory devices are suitable for other applications in which high speed memory may be needed or desired. The described memory device methodologies are not limited to use in communication network devices, but rather may be utilized in other suitable contexts as well.

Figure 1:
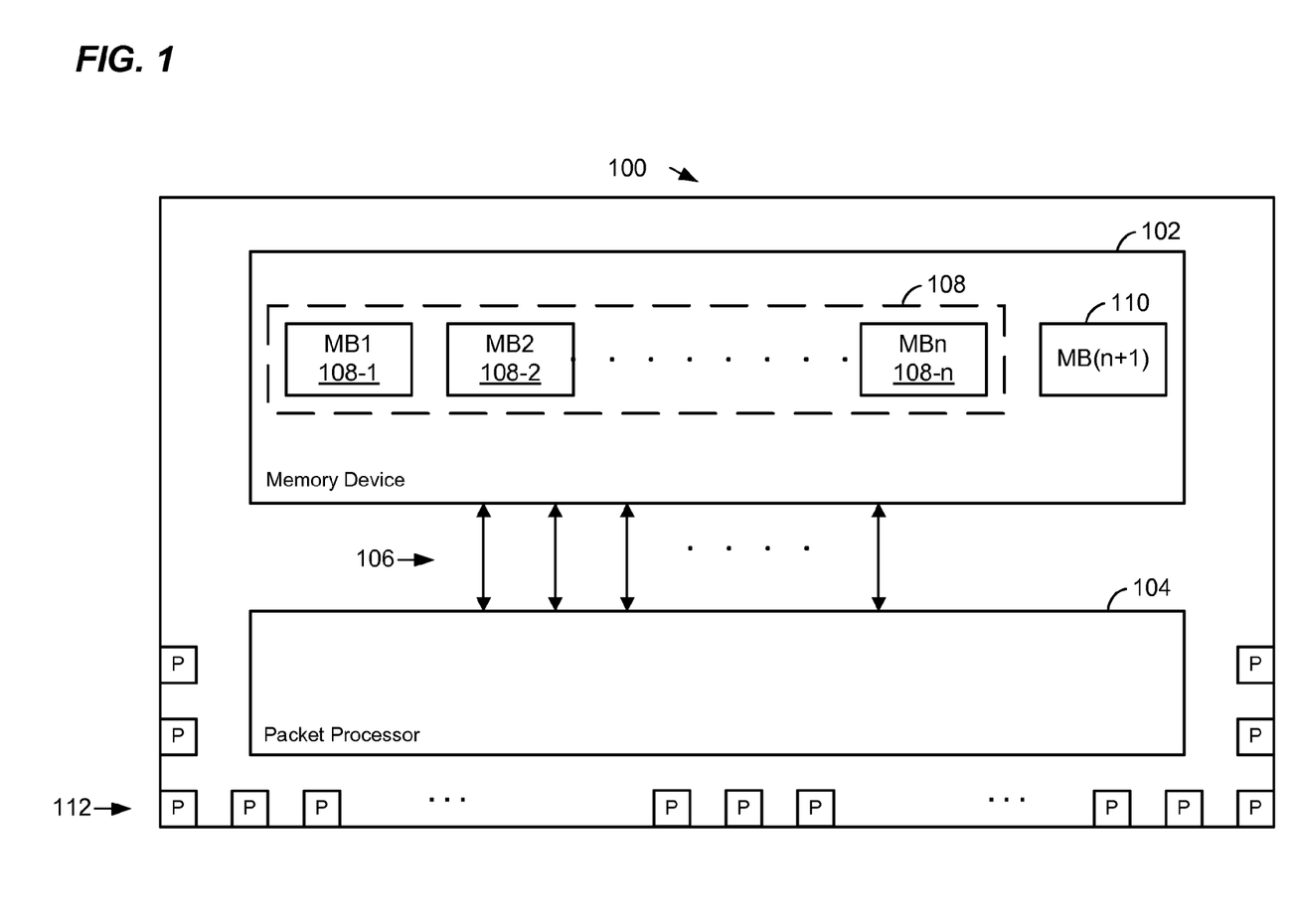
FIG. 1 is a block diagram of an example network device that includes a memory device that configured to support multiple concurrent write operations, according to an embodiment.

FIG. 1 is a block diagram of an example network device 100, such as a Layer-2, a Layer 3, a hybrid Layer2/Layer3 switch, or the like, according to an embodiment. The network device 100 includes a memory device 102 coupled to a packet processor 104 via a plurality of ports (e.g., write ports or read/write ports) 106. The packet processor 104 is further coupled to a plurality of ports (e.g., network ports) 112, and each of the ports 112 is coupled to a respective communication link associated with a communication network and/or to a communication device operating on a communication network. Generally speaking, the packet processor 104 is configured to process packets received via the ports 112 and to determine respective ports 112 via which the packets should be subsequently transmitted, in an embodiment. In an embodiment, the packet processor 104 is configured to utilize the memory device 102 for storing packets received via the ports 112 during processing of the packets by the network device 100 and/or for storing other information (e.g., metering information) determined during processing of packets received by the network device 100. For example, the packet processor 104 is configured to store a packet in the memory device 104 for a time period necessary for performing processing (e.g., ingress processing and/or egress processing) of the packet, or a packet descriptor associated with the packet, by the packet processor 104, in an embodiment. The packet processor 104 is configured to subsequently retrieve the packet from the memory device 102 for transmission of the packet via one or more of the ports 106, in an embodiment.

In an embodiment, the memory device 102 allows multiple blocks of data to be transferred to the memory device 102 in an essentially simultaneous, overlapping or concurrent fashion (e.g., in a single clock cycle). As will be described in more detail below, the memory device 102 includes a plurality of primary memory banks 108 to store data addressed to the memory banks 108. When multiple non-conflicting data blocks (i.e., data blocks addressed to different ones of the memory banks 108) are concurrently received by the memory device 102, the memory device 102 is able to transfer the multiple data blocks, in a single clock cycle, to the memory banks 108 by writing the multiple memory blocks to the respective different ones of the memory banks 108 in a single clock cycle, in an embodiment. The memory device 102 also includes an additional memory bank 110. In an embodiment, the additional memory bank 110 is used to resolve conflicts in situations in which multiple blocks of data concurrently received by the memory device 102 are addressed, meaning need to be written, to a same one of the memory banks 108. In such situations, the memory device 102 is configured to write one or more of the data blocks to the memory bank 108 to which the data blocks are addressed, and to write one or more other data blocks to corresponding memory locations on the additional memory bank 110, as will be explained in more detail below.

In an embodiment, to allow for data to be subsequently properly retrieved from the memory device 102, the memory device 102 is configured to, for each data block stored in the memory banks 108, 110, store an indication of whether the data block is stored at a memory location in a memory bank 108 or rather is stored at a corresponding memory location in the additional memory bank 110. Then, when a data block is to be retrieved from the memory device 102, the memory device 102 is configured to use the indication associated with the data block to determine whether the data is stored in a memory bank 108 or rather is stored in the additional memory bank 110, in an embodiment.

In an embodiment, each memory bank 108, 110 comprises a respective single write port and two respective read ports capable of supporting a respective single write operation and two respective read operations in a single clock cycle. On the other hand, the memory device 102 is a multi-port memory device that, using techniques described herein, allows multiple concurrent write operations to be performed in the memory device 102 in a single clock cycle, in this embodiment. In some embodiments, the memory device 102 also supports multiple read operations to be concurrently performed in the memory device 102. For example, the memory device 102 utilizes example techniques described in the U.S.

patent application Ser. No. 13/302,837, entitled "Sharing Access to a Memory Among Clients," filed on Nov. 22, 2011, which is hereby incorporated by reference herein, in its entirety. In at least some embodiments, these techniques enable the memory device 102 to allow multiple concurrent read operations to be performed in the memory device 102 in a single clock cycle. In an embodiment, the memory banks 108 of the memory device 102 operate at double clock frequency respective to the clock frequency of the network device 100, allowing the memory device 102 to perform multiple read operations concurrently with one or more write operations in the memory device 102. In other embodiments, the memory banks 108 of the memory device 102 operate at the clock frequency of the network device 100. In other embodiments, the memory banks 108 of the memory device 102 operate at a clock frequency that is one half the clock frequency of the network device 100. In some embodiments, each port 106 of the memory device 102 is a read/write port that allows a read and a write operation to be performed in the memory device 102 in a given clock cycle. For example, the memory device 102 having n ports 106 supports n read operations and n operations in a single clock cycle (e.g., single clock cycle of the memory device 102), in such embodiments.

In other embodiments, each memory bank 108, 110 comprises at least m respective write ports and at least 2m respective read ports capable of supporting at least m respective write operations and at least 2m respective read operations in a single clock cycle, where m is a positive integer greater than zero. In these embodiments, using techniques described below, each memory bank 108, 110 provides, in effect, at least 2m read/write ports.

In an embodiment, the memory device 102 is a solid-state device. For example, the memory device 102 is included on an integrated circuit (IC) or other solid-state device. In an embodiment, the memory device 102 and the packet processor (or packet processors) 102 are included on a single IC.

Although the network device 100 is illustrated in FIG. 1 as having a single packet processor 104, the network device 100 includes more than one packet processor 104 coupled to the memory device 102 and configured to share memory space of the memory device 102, in some embodiments. In some such embodiments, the memory device 102 is configured to concurrently receive data blocks from multiple ones of the packet processors 102, and to write received data blocks to multiple ones of the memory banks 108 and/or to the memory banks 110.

Although the memory device 102 is discussed above as being included in the network device 100, similar memory devices may be utilized in other types of computing systems requiring high speed multiple concurrent access memories such as personal computers, servers, mainframes, smart phones, gaming systems, set top boxes, communication equipment, etc. For example, a single processing device (e.g., processor) operating in a computing system may submit multiple concurrent write requests to a memory device such as the memory device 102, and the memory device may act as described herein to enable multiple blocks of data to be concurrently (e.g., simultaneously) written to multiple memory banks within the memory device. As another example, a computing system may include multiple devices (e.g., processors) (e.g., central processing units, coprocessors, special-purpose processing units, etc.), circuits, pipeline stages, etc.) that each act as a client with respect to a memory device such as the memory device 102 and that may submit concurrent (e.g., simultaneous) write requests to the memory device, and the memory device may act as described herein to enable multiple blocks of data to be concurrently (e.g., simultaneously) written to multiple memory banks within the memory device.

Figure 2:
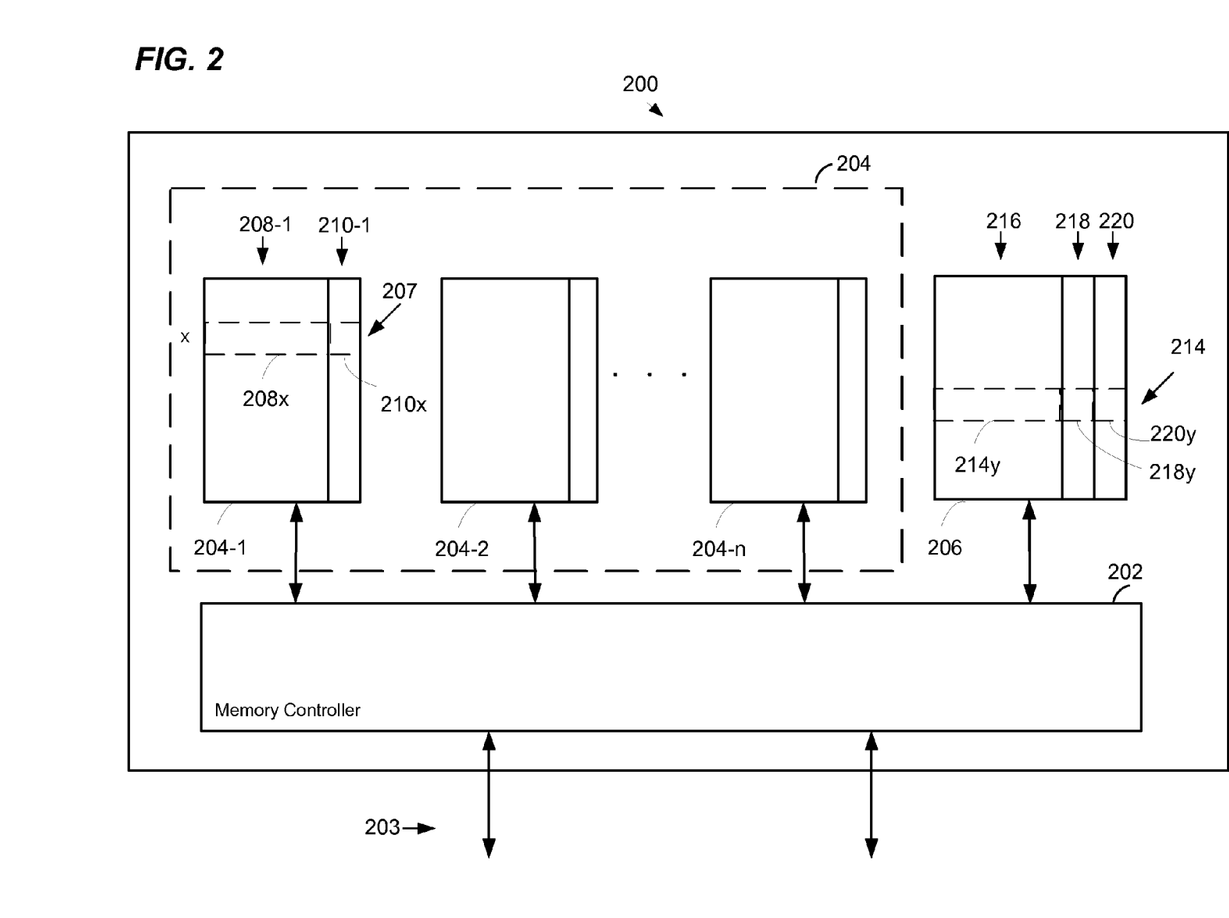
FIG. 2 is a block diagram of a memory device configured to support multiple concurrent write operations, according to an embodiment.

FIG. 2 is a block diagram of a memory device 200 configured to support multiple concurrent write operations in the memory device 200, according to an embodiment. The memory device 200 is utilized as the memory device 102 of FIG. 1, in an embodiment. In another embodiment, another suitable memory device is utilized as the memory device 102 of FIG. 1. Similarly, the memory device 200 is utilized in a network device different than the network device 100 of FIG. 1, or in a computing device used in contexts other than network switching, in other embodiments.

The memory device 200 is a two port memory device having two ports 203-1, 203-2 and capable of supporting up to two concurrent write operations for transferring data received via the ports 203 in a single clock cycle, in an embodiment. The memory device 200 includes a set of memory banks 204 (MB1 204-1, MB2 204-2, . . . , MBn 204-n) to store data addressed to the memory banks 204. When used in the context of a network switch, the set of memory banks 204 stores, for example, packets during processing of the packets (or packet descriptors) by the network device, or other information (e.g., metering information, forwarding databases and/or other control tables) suitable for use for processing packets in a network device, in an embodiment. The memory device 200 includes an additional memory bank (e.g., write parity (WP) bank) MBwp 206. In an embodiment, each of the memory banks 204, 206 supports a single write operation and two read operations during a particular clock cycle (e.g., a clock cycle of the memory device 200, a clock cycle of a solid state device which includes or is coupled to the memory device 200, etc.). In an embodiment, each of the memory banks 204, 206 utilizes example techniques described in the U.S. patent application Ser. No. 13/302,837. On the other hand, the memory device 200 allows two concurrent write operations to be performed to concurrently transfer two data blocks received via the ports 203 to the memory device 200 in a particular clock cycle, in an embodiment. When the memory device 200 concurrently receives two data blocks to be written to different ones of the memory banks 204, the data blocks are written, in a single clock cycle, to the two respective memory banks 204 to which the data blocks are addressed, and validity information indicating that the corresponding memory locations currently hold valid data is updated, as discussed in more detail below, in an embodiment. When the memory device 200 concurrently receives two data blocks to be written to a same one of the memory banks 204, a first data block is written to the one memory bank 204, while a second data block is written to a corresponding memory location in the additional memory bank 206, as will be explained in more detail below, in an embodiment.

The memory device 200 includes a memory controller 202 coupled to the ports 203 and configured to perform operations (e.g., write operations, read operations, etc.) in the memory banks 204, 206. For example, the memory controller 202 is configured to receive write requests via the ports 203 and, in response to receiving the write requests, to write data presented at the ports 203 to appropriate memory locations in the memory banks 204, 206, in an embodiment. The memory controller 202 is also configured to receive read requests via the ports 203 or and to transfer the requested data from the memory banks 204, 206 to the ports 203, in some embodiments.

In some embodiments, the memory device 200 is a logical arrangement of physical resources, and in some embodiments, the memory device 200 is at least partially a physical arrangement of physical resources. In an embodiment, each memory bank (e.g., MB1-MBn 204, MBwp 206) is of a same size and includes a same set of one or more unique addresses. For example, each of the memory bank 204 and the memory bank 206 corresponds to a same address space, in an embodiment. In other embodiments, the memory banks (e.g., MB1-MBn 204, MBwp 206) may have two or more different sizes and/or correspond to two or more different address spaces.

In an embodiment, each memory bank 204 comprises a plurality of memory cells organized as an array having rows and columns. In this embodiment, a memory location in a memory bank 204 corresponds to a particular row of the memory bank 204 indexed by a corresponding row number. In an embodiment, each memory location in a memory bank 204 is associated with a validity indication used to indicate whether the corresponding memory location currently holds valid data addressed to the memory banks 204. For example, each row of a memory bank 204 comprises a data portion that spans the first n columns of the row and a validity indication that spans one or several columns at the end of the row, in an embodiment. FIG. 2 depicts an example memory location 207 in the memory bank 204-1, according an embodiment. The memory location 207 corresponds to a row X of the memory bank 204-1, with first n columns (e.g., bits) of the row X (indicated in FIG. 2 as a data portion 208$x$) used to store data addressed to the row X in the memory bank 204-1, and last one or several columns (e.g., bits) of the row X (indicated in FIG. 2 as a validity indicator 210$x$) used to indicate whether the data portion 208$x$ currently holds valid data addressed to the memory bank 204-1. The memory bank 204-1 thus includes a data columns 208-1 and one or more validity information columns 210-1. As will be explained in more detail below, to indicate that a data block addressed to the memory location X in the memory bank 204-1 is stored in the memory bank 204-1, the memory controller 202 determines a value of the validity indication 210$x$ based on a current value of the corresponding validity indication associated with the corresponding memory location X in the memory bank 206 such that a combination of the corresponding validity indications in the memory bank 204 and the memory bank 206 indicates that the data block addressed to the memory bank 204 is stored in the memory bank 204 and not in the memory bank 206, in an embodiment.

Referring still to FIG. 2, the write parity bank MBwp 206, provided as a memory bank in addition to the memory banks 204, is structured in a manner similar to the memory banks 204, in an embodiment. However, each memory location (e.g., row) of the MBwp 206 is also associated with a memory bank number indication 220, in addition to a validity indication 218, in an embodiment. FIG. 2 depicts an example memory location 214 in the memory bank MBwp 206, according to an embodiment. The memory location 214 corresponds to a row Y of the memory bank MBwp 206, with n columns of the row Y (indicated in FIG. 2 as a data portion 214$y$) used to store data addressed to a row Y in a memory bank 204 (when the memory bank 204 to which the data is addressed is unable to accept the data due to another write operation being performed in the memory bank 204), followed by one or several columns 218$y$ for indicating validity of data stored in the row Y of the MBwp 206, and one or several columns 220$y$ used for indicating to which of the of the memory banks 204 data stored in the row Y of the memory bank 206 is addressed. As will be explained in more detail below, to indicate that a data block addressed to a memory location Y in a memory bank 204 is actually stored in the corresponding memory location Y in the memory bank 206, the memory controller 202 determines a value of the validity indication 218$y$ based on a current value of a validity indication associated with the memory location Y in the memory bank 204 to which the data block is addressed such that a combination of the corresponding validity indications in the memory bank 204 and the memory bank 206 indicates that the data block addressed to the memory bank 204 is stored in the memory bank 206 and not in the memory bank 204, in an embodiment.

In an embodiment, each memory bank 204 comprises a plurality of rows structured as the example row 207 of the memory bank 204-1. Similarly, the memory bank 206 includes a plurality of rows structured as the row 214, in an embodiment. In other embodiments, the memory banks 204, 206 are structured in other suitable manners. For example, in some embodiments, the memory banks 204, 206 include suitable memory locations other than rows of the memory banks 204, 206 and/or each memory location in the memory banks 204, 206 is associated with appropriate indications (e.g., validity indication, memory bank indication) in other suitable manners. In an embodiment, each row in the memory bank 206 corresponds to a respective row in each of the memory banks 204. For example, row X in the memory bank 206 corresponds to row X in each of the memory banks 204, and row Y in the memory bank 206 corresponds to row Y in each of the memory banks 204, in an embodiment.

Figure 3:
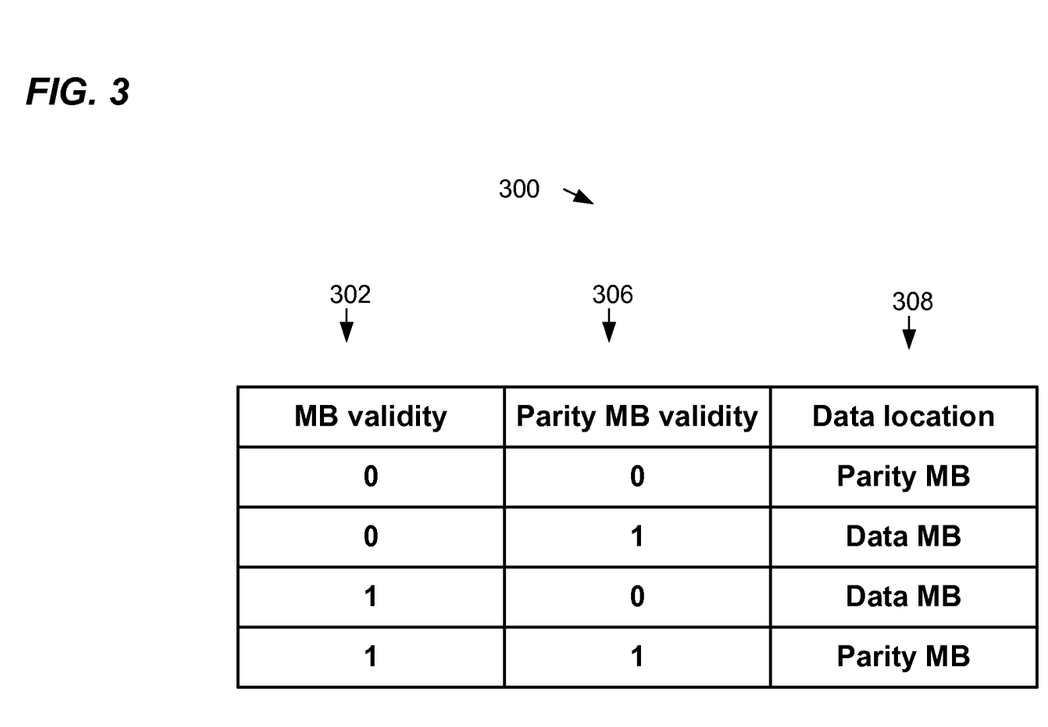
FIG. 3 depicts an example table according to which validity indication values are determined, according to an embodiment.

FIG. 3 depicts an example Table 300 according to which validity indication values are determined, according to an embodiment. In particular, the example table 300 illustrates combinations of values of corresponding validity indications 210, 218 associated with corresponding memory locations in a memory bank 204 and the memory bank 206 used by the memory controller 202 to indicate whether a particular data block addressed to a memory bank 204 is stored in the memory bank 204 or is stored in a corresponding memory location in the memory bank 206, in an embodiment. During read operations, the validity indication value combinations of Table 300 and the memory bank number indications 220 are used by the memory controller 202 to determine whether data to be retrieved is stored in a memory location in a memory bank 204 or in a corresponding memory location in the memory bank 206, in an embodiment. While the Table 300 illustrates example validity indication value combinations used by the memory controller 202 to indicate a location at which a particular data block is stored in the memory device 200, the memory controller 202 is configured to utilize validity indication values other than the values shown in Table 300 to indicate the location at which a particular data block is stored, in other embodiment.

In an embodiment, validity indication values shown in the Table 300 are used by the memory controller 202 to indicate a location of a data block addressed to a memory location in a particular memory bank 204 when the corresponding memory location in the memory bank 206 is associated with the particular memory bank 204, e.g., via a bank number indication associated with the memory location in the memory bank 206. With reference to the table 300 of FIG. 3, a column 302 shows a value of a validity indication associated with a particular memory location in a memory bank 204 (e.g., row X), a column 306 shows a value of a validity indication associated with a corresponding memory location in the memory bank 206 (e.g., row X), and a column 308 shows the location indicated by the combination of validity indication values in corresponding rows of the column 302 and the column 306. Thus, for example, a combination of a value of zero (0) of validity indication associated with a particular memory location a memory bank 204 (e.g., row X) and a value of zero (0) of validity indication associated with a corresponding memory location in the memory bank 206

(e.g., row X) indicates that the data block addressed to the memory location in the memory bank 204 is actually stored at the corresponding memory location in the memory bank 206. On the other hand, a combination of a value of zero (0) of a validity indication associated with a particular memory location in a memory bank 204 (e.g., row X) and a value of one (1) of validity indication associated with a corresponding memory location in the memory bank 206 (e.g., row X) indicates that the data addressed to the memory location in the memory bank 204 is actually stored at the particular memory location in the memory bank 204.

Similarly, referring still to table 300 of FIG. 3, a combination of a value of one (1) of a validity indication associated with a particular memory location in a memory bank 204 (e.g., row X) and a value of zero (0) of a validity indication associated with a corresponding memory location in the memory bank 206 (e.g., row X) indicates that a data block addressed to the memory location in the memory bank 204 is actually stored at the particular memory location in the memory bank 204. On the other hand, a combination of a value of one (1) of a validity indication associated with a particular memory location in a memory bank 204 (e.g., row X) and a value of one (1) of a validity indication associated with a corresponding memory location in the memory bank 206 (e.g., row X) indicates that a data block addressed to the memory location in the memory bank 204 is actually stored at the corresponding memory location in the memory bank 206.

Figure 4:
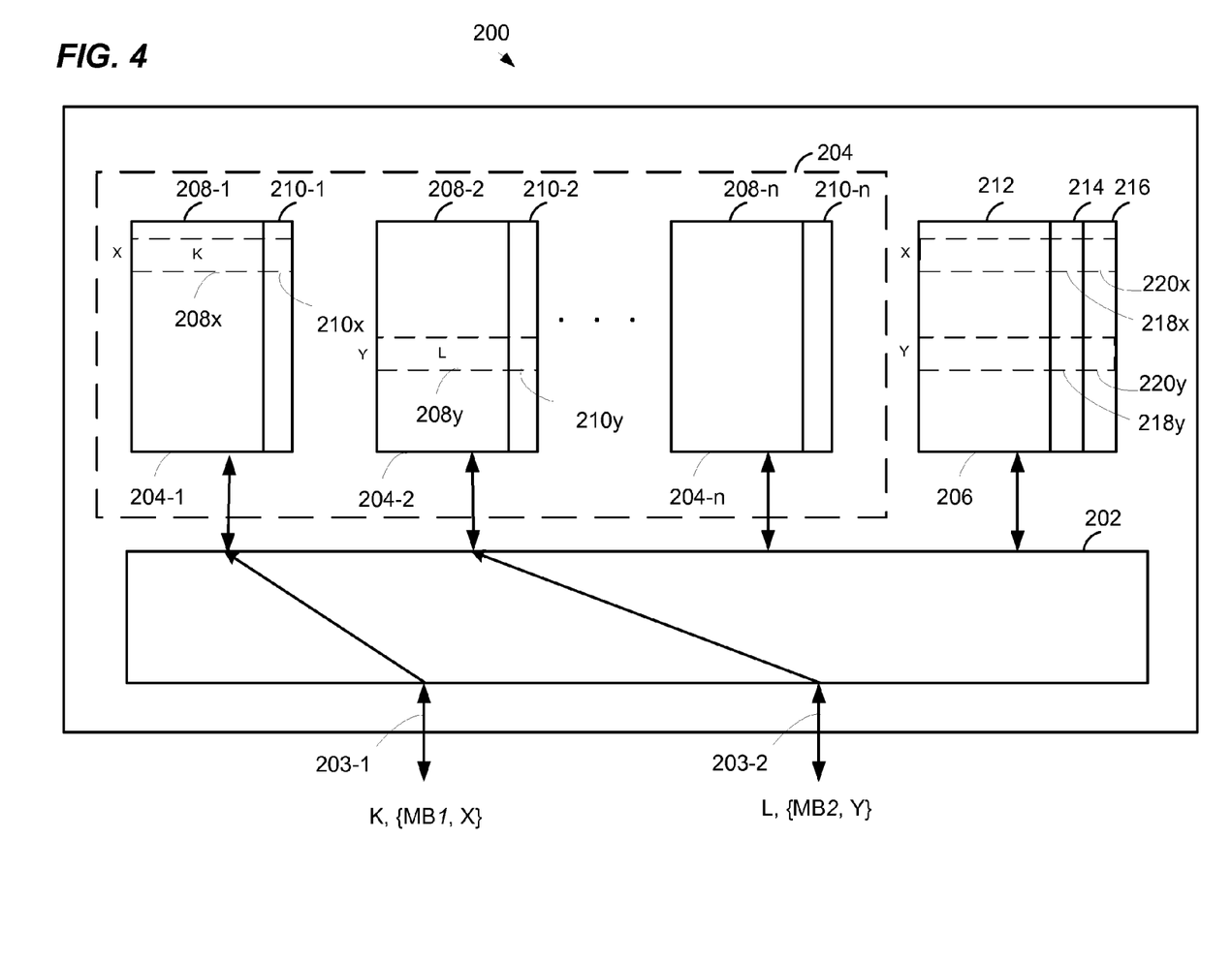
FIG. 4 is a diagram depicting an example scenario of concurrent write operations performed in a memory device, according to an embodiment.

FIG. 4 is a diagram depicting an example scenario of concurrent write operations performed in the memory device 200 of FIG. 2, according to an embodiment. In the scenario of FIG. 4, the memory controller 202 concurrently receives two data blocks via the ports 203. In particular, the memory controller 202 receives a first data block K via the port 203-1 and a second data block L via the port 203-2, which data blocks K and L are to be concurrently written to memory at appropriate locations. The data block K is addressed to a memory location (e.g., row) X in the memory bank MB1 204-1, and the data block L is addressed to a memory location (e.g., row) Y in the memory bank MB2 204-2. Because, in this scenario, the two concurrently received data blocks K and L are addressed to different ones of the memory banks 204, the memory controller 202 is able to, in a single clock cycle, write the two data blocks K and L directly to the memory bank MB1 204-1 and the memory bank MB2 204-2, respectively. Thus, in the illustrated scenario, the memory controller 202 writes, in a single clock cycle, the data block K to the memory bank MB1 204-1 at the memory location X and the data block L to the memory bank MB2 204-2 at the memory location Y, in an embodiment.

In an embodiment, the memory controller 202 sets appropriate indications to indicate that the data blocks K and L are stored in the memory banks MB1 204-2 and MB2 204-2, respectively, and not in the corresponding memory locations in the memory bank MBwp 206. To this end, in an embodiment, the memory controller 202 appropriately sets the validity indication 210x in the memory bank 204-1 to indicate that the row X of the memory bank 204-1 holds valid data addressed to the memory bank 204-1. Similarly, the memory controller 202 appropriately sets the validity indication 210y in the memory bank 204-2 to indicate that the row Y of the memory bank 204-2 holds valid data addressed to the memory bank 204-2.

In an embodiment, the memory controller 202 determines an appropriate value for the validity indication 210x based on the current value of the validity indication 218x and the current value of the memory bank number indication 220x in the row X of the write parity memory bank 206. For example, the memory controller 202 determines whether the value of the memory bank indication 220x corresponds to the memory bank 204-1. In response to determining that the indication 220x does not correspond to the memory bank MB1 204-1, the memory controller 202 determines that the value of the validity indication 210x can remain unchanged, in an embodiment. On the other hand, in response to determining that the indication 220x corresponds to the memory bank MB1 204-1, the memory controller 202 determines an appropriate value for the indication 210x based on the current value of the indication 218x in the memory bank MBwp 206 such that the combination of the value of the indication 210x and the indication 218x indicates that the data block K is stored in the MB1 204-1 and not in the MBwp 206. For example, the memory controller 202 determines the value of the indication 210x, based on the current value of the indication 218x, according to Table 300 of FIG. 3, in an embodiment. Similarly, if the value of the memory bank number indication 220y corresponds to the memory bank MB2 204-2, the memory controller 202 determines an appropriate value for the validity indication 210y in the MB2 204-2 based on the current value of the validity indication 218y in the memory bank MBwp 206, in an embodiment. On the other hand, if the indication 220y does not correspond to the memory bank MB2 204-2, the memory controller 202 determines that the value of the validity indication 210y can remain unchanged, in an embodiment.

Figure 5:
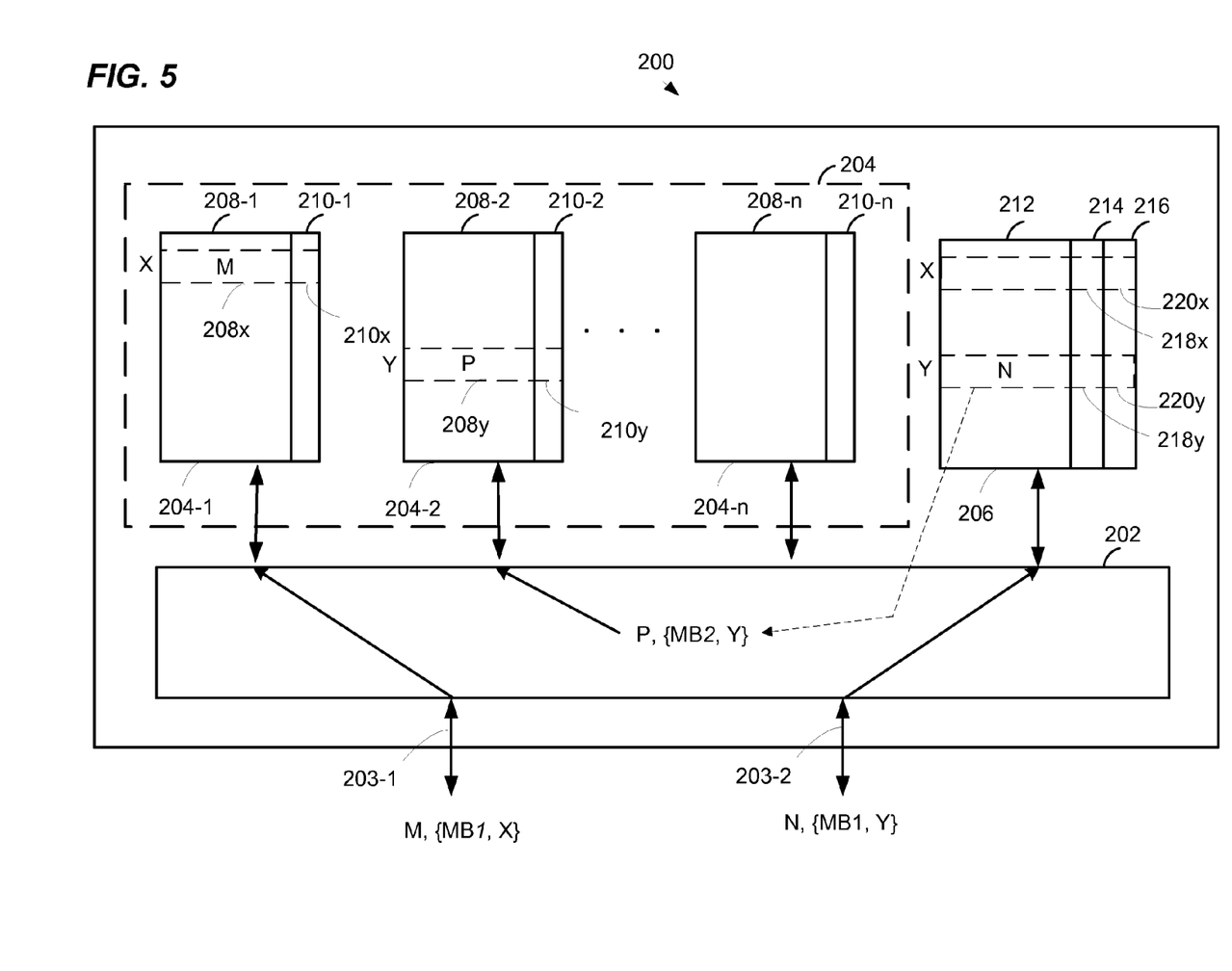
FIG. 5 is a diagram depicting another example scenario of concurrent write operations performed in a memory device, according to an embodiment

FIG. 5 is a diagram depicting another example scenario of concurrent write operations performed in the memory device 200 of FIG. 2, according to an embodiment. Similar to the scenario of FIG. 4, in the scenario of FIG. 5, the memory controller 202 receives two concurrent data blocks via the ports 203 which are to be concurrently written to appropriate locations in memory. However, unlike the scenario of FIG. 4, in the scenario of FIG. 5, the data blocks concurrently received via the ports 203 are both addressed to a same memory bank 204 (e.g., the memory bank MB1 204-1). In particular, in the illustrated scenario, the memory controller 202 receives, via the port 203-1, a data block M addressed to a memory location X in the memory bank MB1 204-1. The memory controller 202 concurrently receives a data block N addressed to a memory location Y in the memory bank MB1 204-1, in the illustrated scenario. In this scenario, the memory controller 202 is unable to write both of the data blocks M, N to the memory bank 204 (e.g., 204-1) in a single clock cycle. In this case, the memory controller 202 selects one of the blocks M, N to be written directly to the memory bank MB1 204-1 and the other one of the blocks M, N to be written to the memory bank MBwp 206. For example, the memory controller 202 selects the block M to be written to the memory bank 204-1 and the data block N to be written to the memory bank MBwp 206. In an embodiment, the memory controller 202 writes, in a single clock cycle, the data block M to the memory location X in the memory bank MB1 204-1 and the data block N to the memory location Y in the memory bank MBwp 206. Also, the memory controller 202 sets the validity indication 210x associated with the memory location X in the memory bank MB1 204-1 to indicate that the memory location X in the memory bank 204-1 holds valid data addressed to the memory bank MB1 204-1, in an embodiment. For example, the memory controller 202 sets the validity indication 210x associated with the memory location X in the memory bank MB1 204-1 according to Table 300 of FIG. 3 as discussed above with respect to the scenario of FIG. 4, in an embodiment. Similarly, the memory controller 202 sets the validity indication 218y and the memory bank number indication 220y in the memory bank MBwp 206 to indicate that the memory location Y in the memory bank MBwp 206 holds valid data addressed to the memory location Y in the memory bank MB1 204-1, in an embodiment. For example, the memory controller 202 sets the validity indication 220y according to Table 300 of FIG. 3 based on the current value of the validity indication 210y in the memory bank MB1 204-1, in the manner discussed above with respect to FIG. 4, and sets the memory bank number indication 216y to a numeric one (1) to indicate MB1 204-1, in an embodiment.

In an embodiment, prior to writing a data block to the memory bank MBwp 206, the memory controller 202 determines whether the memory location in the memory bank MBwp 206 currently holds a valid data block addressed to a particular memory bank 204. For example, in the scenario of FIG. 5, prior to writing the data block N to the memory location Y in the memory bank MBwp 206, the memory controller 202 retrieves a data block P currently stored at the memory location Y in the memory bank MBwp 206, and determines whether the data block P is a valid data block addressed to a certain memory 204. In an embodiment, the memory controller 202 makes the determination based on the memory bank number indication 220y, the validity indication 218y associated with the memory location Y in the memory bank MBwp 206, and the validity indication associated with the corresponding memory location in the memory bank 204 indicated by the memory bank number indication 220y. For example, in the scenario of FIG. 5, the memory bank number indication 220y indicates memory bank MB2 204-2. The memory controller 202 then determines whether the data block P is a valid data block addressed to the memory bank MB2 204-2 based on a combination of validity indication 210y associated with the memory location Y in the memory bank MB2 204-2 and the value of the validity indication 218y associated with the memory location Y in the memory bank MBwp 206, in an embodiment. For example, the memory controller 202 determines whether the data block P is a valid data block addressed to the memory bank MB2 204-2 according to Table 300 of FIG. 3, in an embodiment. In an embodiment, in response to determining that the data block P is a valid data block addressed to the memory location Y in the memory bank MB2 204-1, the memory controller 202 writes the data block P to the memory location Y in the MB2 204-2. Then, the memory controller 202 updates the validity indication 210y associated with the memory location Y in the memory bank MB2 204-2 to indicate that the data block P is stored in the memory bank MB2 204-2 and not in the memory bank MBwp 206, in an embodiment. In an embodiment, the memory controller 202 writes the data block P to the memory bank 204-1 concurrently (e.g., during the same clock cycle) with writing of the data block M to the memory bank MB1 204-1 and writing of the data block N to the memory location Y in the memory bank MBwp 206.

Figure 6:
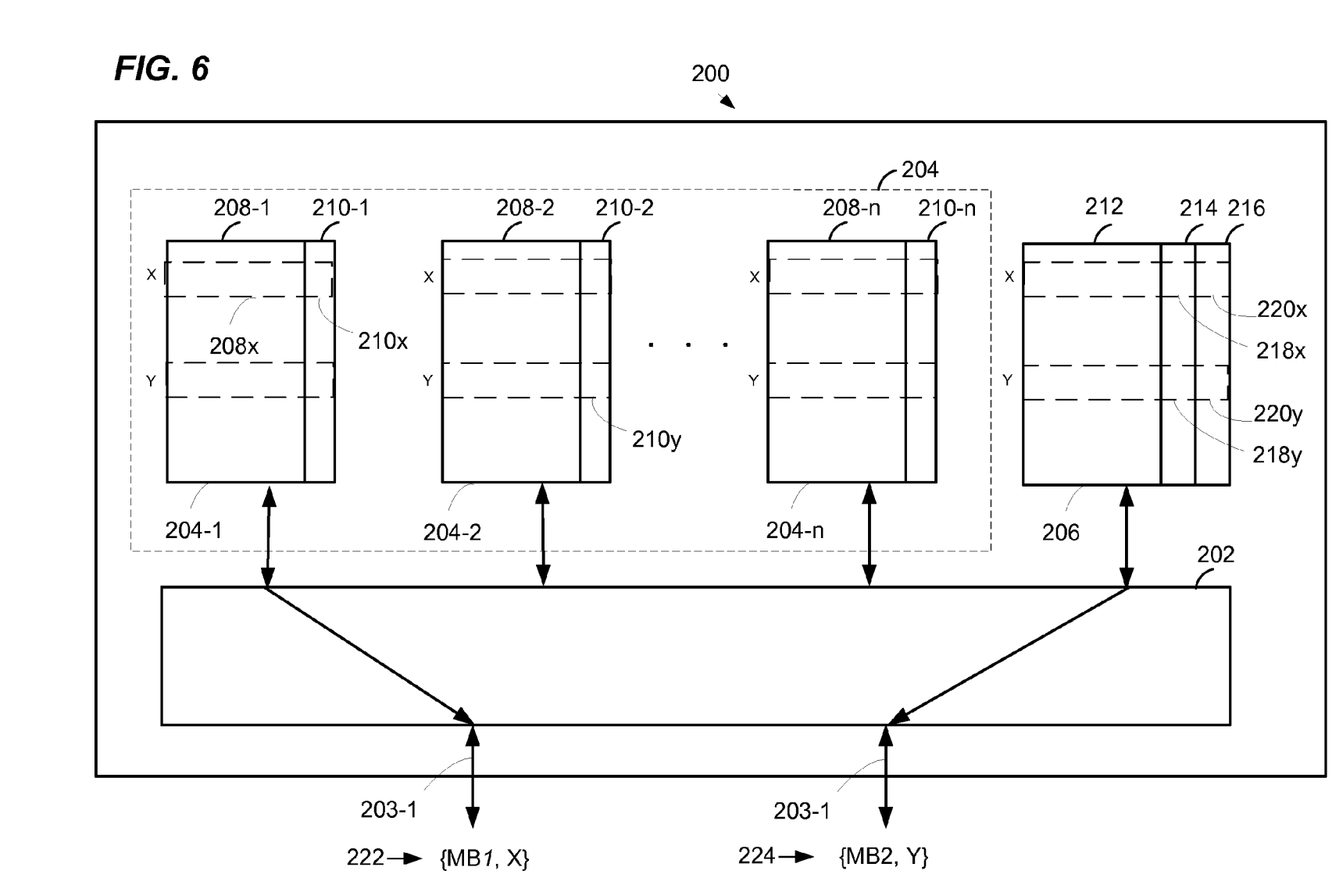
FIG. 6 is a diagram illustrating a read operation performed by a memory device, according to an embodiment.

FIG. 6 is a diagram illustrating a read operation performed by the memory device 200 to retrieve data, according to an embodiment. In the scenario of FIG. 6, the memory controller 202 receives a read request 222 to retrieve a data block having an address corresponding the memory location X in the memory bank MB1 204-1. In an embodiment, to correctly retrieve the requested data block, the memory controller 202 determines whether the requested data block is stored in the memory location X in the memory bank MB1 204-1 or is stored in the memory location X in the write parity memory bank MBwp 206. In an embodiment, the memory controller 202 makes the determination based on validity indication associated with the memory location X in the memory bank MB1 204-1 and validity indication associated with the memory location X in the memory bank MBwp 206, in an embodiment. For example, the memory controller 202 retrieves the row X from the memory bank MB1 204-1 and the row X from the memory bank MBwp 206, in an embodiment. The memory controller 202 then determines whether the value of the bank number indication 220x in the memory bank MBwp 206 corresponds to the memory bank MB1 204-1. A determination that the value of the memory bank number indication 220x in the memory bank MBwp 206 does not correspond to memory bank MB1 204-1 indicates to the memory controller 202 that the requested data block is stored in the row X of the memory bank MB1 204-1.

Accordingly, in response to determining that the bank number indication 220x does not correspond to the memory bank MB1 204-1, the memory controller 202 outputs the data block retrieved from the memory location X of the memory bank MB1 204-1, in an embodiment.

On the other hand, if it is determined that the value of the memory bank number indication 220x corresponds to the memory bank MB1 204-1, the memory controller 202 makes a determination in regard to location of the requested data block based on the value of the validity indication 210x associated with the memory location X in the memory bank 204-1 and the validity indication 218x associated with the memory location X in the memory bank MBwp 206. In an embodiment, the memory controller 202 determines the location of the requested data block based on a combination of the value of the validity indication 210x and the value of the validity indication 218x according to the Table 300 of FIG. 3. As just an example, assuming that the memory bank number indication 220x corresponds to the memory bank MB1 204-1, if the value of the validity indication 210x is a logic zero (0) and the value of the validity indication 218x is a logic zero (0), then the memory controller 202 determines that the requested data block is stored in the memory bank MBwp 206, in this embodiment. In response to determining that the bank number indication 220x corresponds to memory bank MB1 204-1 and that the requested data is stored in the memory bank MBwp 206, the memory controller 202 outputs the data block retrieved from the memory location X of the memory bank MBwp 206, in an embodiment. On the other hand, continuing with the same embodiment, if the value of the validity indication 210x is a logic zero (0) and the value of the validity indication 218x is a logic one (1), then the memory controller 202 determines that the requested data block is stored in the memory bank MB1 204-1. In response to determining that the memory bank number indication 218x corresponds to memory bank MB1 204-1 and that the requested data is stored in the memory bank MB1 204-1, the memory controller 202 outputs the data block retrieved from the memory location X of the memory bank MB1 204-1, in an embodiment.

In an embodiment, concurrently with receiving the request 222 to retrieve data from the memory location X in the memory bank MB1 204-1, the memory controller 202 receives a request 224 to retrieve data from the memory location Y in the memory bank MB2 204-2. In this case, the memory controller 202 performs operations similar to those discussed above with respect to the request 220 to also determine whether the data block requested via the read request 222 is stored at the memory location Y in the memory bank MB2 204-2 or is stored in the corresponding memory location (i.e., the memory location Y) in the memory bank MBwp 206, in an embodiment. In this manner, the memory controller 202 is able to correctly output the data requested via the request 222, in an embodiment.

Although the memory device 200 is described herein as having two read/write ports 203, the techniques described herein can easily be scaled to implement memory devices having greater numbers of read/write ports. For example, a memory device having four read/write (R/W) ports (i.e., capable of performing four read operations and four write operations in a given clock cycle) is implemented using a plurality of memory banks each capable of supporting four read operations and two write operations in a given clock cycle, with each of the memory banks having an additional column (validity indication column), and an additional memory bank (write parity memory bank) having two additional columns (validity indication column and bank number column), in an embodiment. Generally speaking, a 2N read/write port memory device can be implemented using a plurality of 2N read/N write port memory banks, each having an additional column (validity indication column), and an additional 2N read/N write port memory bank (write parity memory bank) having two additional columns (validity indication column and bank number column), in various embodiments. Thus, a 2N read/write port memory device having the same memory capacity as a plurality of 2N read/N write port memory banks can be implemented, using techniques described herein, with an overhead of only an additional column (validity indication column) in each one of the plurality of 2N read/N write port memory banks, and an additional write parity 2N read/N write port memory bank having two additional columns (validity indication column and bank number indication column), in various embodiments.

Figure 7:
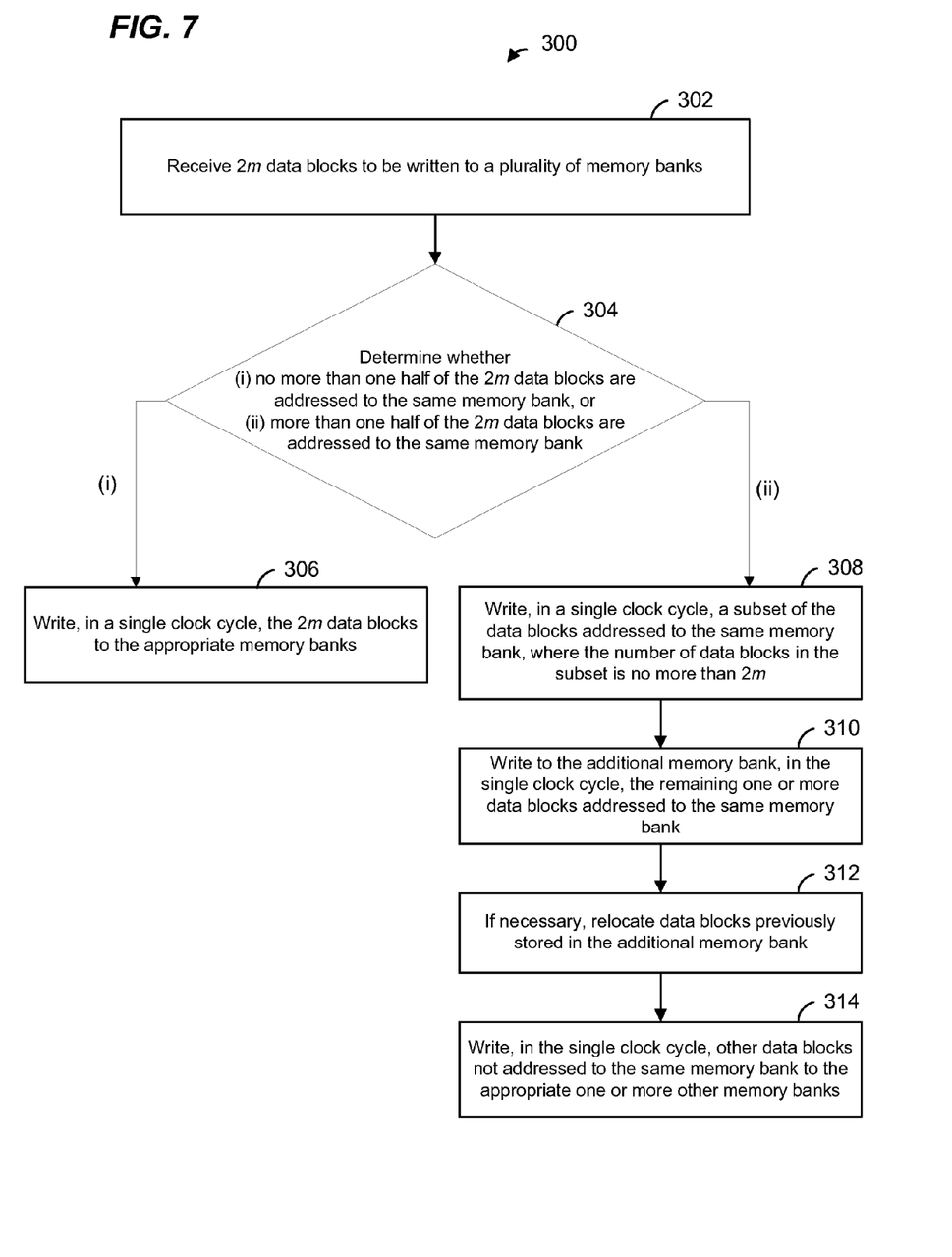
FIG. 7 is flow chart of an example method of performing memory operations in a memory device having a plurality of memory banks and an additional memory bank, according to an embodiment.

FIG. 7 is flow chart of an example method 300 of performing memory operations in a memory device having a plurality of memory banks and an additional memory bank, according to an embodiment. Each memory bank of the plurality of memory banks and the additional memory bank is each configured to perform at most m write operations and at least 2m read operations in a single clock cycle, where m is a positive integer greater than zero. The method 300 is implemented by the memory device 102 of the network device 100 of FIG. 1, in an embodiment. In another embodiment, the method 300 is implemented by the memory device 200 of FIGS. 2-5. In other embodiments, the method 300 is implemented by other suitable memory devices.

At block 302, 2m data blocks to be written to the plurality of memory banks are received. For example, two data blocks are received, in an embodiment. In another embodiment, greater than two data blocks are received. In an embodiment, at least a first data block and a second data block are received.

At block 304, it is determined whether (i) no more than one half of the 2m data blocks are addressed to the same memory bank or (ii) more than one half of the 2m data blocks are addressed to the same memory bank. For example, when m=1, it is determined whether the first data block and the second data block received at block 302 are addressed to the same memory bank.

When it is determined at block 304 that no more than one half of the 2m data blocks are addressed to the same memory bank, the method 300 flows to block 306 at which the 2m data blocks received at block 302 are written, in a single clock cycle, to the appropriate memory banks. On the other hand, when it is determined at block 304 that more than one half of the 2m data blocks are addressed to the same memory bank, the method 300 flows to block 308.

At block 308, a subset of the data blocks addressed to the same memory bank, i.e., the addressed memory bank, is written to the addressed memory bank in a single clock cycle, wherein the number of data blocks in the subset of data blocks is no more than 2m. In an embodiment, the number of data blocks in the subset of data blocks is equal to 2m. For example, when m=1, the first data block is written to the memory bank to which it was addressed. In an embodiment, block 308 includes storing information that indicates that the one or more data blocks in the subset are written to the addressed memory bank. In an embodiment, such indications allow the memory device to subsequently determine that the data block(s) in the subset are stored in the addressed memory bank rather than the additional memory bank, such as for the purpose of correctly retrieving the data block(s) in the subset.

At block 310, a remaining one or more data blocks addressed to the same memory bank are written to the additional memory bank in the same clock cycle. For example, when m=1, the second data block is written to the additional memory bank. In an embodiment, block 310 includes storing information that indicates that the remaining one or more data blocks are written to the additional memory bank. In an embodiment, such indications allow the memory device to subsequently determine that the one or more data block are stored in the additional memory bank rather than the addressed memory bank, such as for the purpose of correctly retrieving the data block(s) in the subset.

At block 312, one or more data blocks previously stored in the additional memory bank are relocated to one or more of the plurality of memory banks, if necessary. For example, if a data block to be stored in the additional memory bank at block 310 will overwrite a previously stored data block, the previously stored data block is relocated to one of the other memory banks.

At block 314, one or more data blocks not addressed to the same memory bank are written to the appropriate memory bank(s) in the single clock cycle.

In an embodiment, blocks 306 and 314 includes storing information that indicates that the stored data blocks are written to the appropriate one or more memory banks as opposed to the additional memory bank.

In some embodiments, block 314 is omitted. For example, when m=1, block 314 is omitted, in an embodiment.

At least some of the various blocks, operations, and techniques described above may be implemented utilizing hardware, a processor executing firmware instructions, a processor executing software instructions, or any combination thereof. For example, at least some of the various blocks, operations, and techniques described above may be implemented in a custom integrated circuit (IC), an application specific IC (ASIC), a programmable logic device, etc.

While the present invention has been described with reference to specific examples, which are intended to be illustrative only and not to be limiting of the invention, changes, additions and/or deletions may be made to the disclosed embodiments without departing from the scope of the invention.

What is claimed is:

1. A method of performing memory operations, the method comprising:
receiving a plurality of data blocks to be written to one or more memory banks among a plurality of memory banks, including receiving at least a first data block and a second data block, the plurality of memory banks including one or more primary memory banks and at least one additional memory bank;
determining whether (i) the first data block and the second data block are addressed to respective different primary memory banks among the plurality of memory banks or (ii) the first data block and the second data block are both addressed to of the same primary memory bank in the plurality of memory banks;
in response to determining that the first data block and the second data block are addressed to respective different primary memory banks among the plurality of memory banks, writing, in a single clock cycle, the first data block and the second data block to the respective different primary memory banks; and in response to determining that the first data block and the second data block are both addressed to the same primary memory bank in the plurality of memory banks, writing, in the single clock cycle, the first data block to the same primary memory bank and the second data block to the additional memory bank.

2. The method of claim 1, wherein determining that the first data block and the second data block are both addressed to the same primary memory bank in the plurality of memory banks includes determining that the first data block is addressed to a first memory location in the same primary memory bank and the second data block is addressed to a second memory location in the same primary memory bank, and wherein writing the first data block to the same primary memory bank comprises writing the first data block to the first memory location in the same primary memory bank and writing the second data block to the additional memory bank comprises writing the second data block to a memory location in the additional memory bank that corresponds to the second memory location in the same primary memory bank.

3. The method of claim 2, further comprising updating a value of a first indication, the first indication associated with the first memory location in the first memory bank, to indicate that the first data block is stored in the same primary memory bank and not in the additional memory bank, and updating a value of a second indication, the second indication associated with the memory location in the additional memory bank that corresponds to the second memory location in the same primary memory bank, to indicate that the second data block is stored in the additional memory bank and not in the same primary memory bank.

4. The method of claim 3, wherein:

updating the value of the first indication includes determining the value of the first indication based on information associated with a corresponding memory location in the additional memory bank, and updating the value of the second indication includes determining the value of the second indication based on information associated with the second memory location in the same primary memory bank.

5. The method of claim 1, wherein writing the second data block to the additional memory bank includes:

retrieving a third data block currently stored in the memory location in the additional memory bank that corresponds to the second memory location in the same primary memory bank; and writing the third data block to another primary memory bank in the plurality of memory banks.

6. The method of claim 5, wherein writing the third data block to the another primary memory bank comprises writing the third data block during the clock cycle used for writing the first data block and the second data block.

7. The method of claim 5, further comprising updating an indication associated with a memory location in the another primary memory bank to which the third data block was written to indicate that the third data block is stored in the another primary memory bank and not in the additional memory bank.

8. The method of claim 3, further comprising, subsequent to writing the second data block to the additional memory bank, retrieving the second data block, including determining, based on the second indication, that the second data block is in the additional memory bank and not in the same primary memory bank.

9. A memory device comprising:

a plurality of memory banks for storing data, including a plurality of primary memory banks and one or more additional memory banks;

two or more ports configured to receive respective two or more data blocks; and a memory controller coupled to the two or more ports, the memory controller configured to:

receive, via the two or more ports, a plurality of data blocks to be written to the plurality of memory banks, including at least a first data block and a second data block;

determine whether (i) the first data block and the second data block are addressed to respective different primary memory banks among the plurality of memory banks or (ii) the first data block and the second data block are both addressed to a same primary memory bank in the plurality of memory banks;

in response to determining that the first data block and the second data block are addressed to respective different primary memory banks among the plurality of memory banks, write, in a single clock cycle, the first data block and the second data block to the respective different primary memory banks; and in response to determining that the first data block and the second data block are addressed to the same primary memory bank, write, in the single clock cycle, the first data block to the same primary memory bank and the second data block to the additional memory bank.

10. The memory device of claim 9, wherein the memory controller is further configured to:

determine that the first data block is addressed to a first memory location in the same primary memory bank and the second data block is addressed to a second memory location in the same primary memory bank, write the first data block to the first memory location in the same primary memory bank, and write the second data block to a memory location in the additional memory bank that corresponds to the second memory location in the same primary memory bank.

11. The memory device of claim 10, wherein the memory controller is further configured to:

update a value of a first indication, the first indication associated with the first memory location in the same primary memory bank, to indicate that the first data block is stored in the same primary memory bank and not in the additional memory bank, and update a value of a second indication, the second indication associated with the memory location in the additional memory bank corresponding to the second memory location in the same primary memory bank, to indicate that the second data block is stored in the additional memory bank and not in the same primary memory bank.

12. The memory device of claim 11, wherein the memory controller is configured to:

determine the value of the first indication based on information associated with the additional memory bank, and determine the value of the second indication based on information associated with the second memory location in the same primary memory bank.

13. The memory device of claim 9, wherein the memory controller is further configured to, prior to writing the second data block to the additional memory bank:
retrieve a third data block currently stored in the memory location in the additional memory bank corresponding to the second memory location in the same primary memory bank; and
write the third data block to a memory location in another primary memory bank.

14. The memory device of claim 13, wherein the memory controller is configured to write the third data block to the another primary memory bank during the clock cycle used for writing the first data block and the second data block.

15. The memory device of claim 13, wherein the memory controller is further configured to update an indication associated with a memory location in the another primary memory bank to which the third data block was written to indicate that the third data block is stored in the another primary memory bank and not in the additional memory bank.

16. The memory device of claim 11, wherein the memory controller is further configured to, subsequent to writing the second data block to the additional memory bank,
determine, based on the second indication, that the second data block is in the additional memory bank and not in the same primary memory bank, and
retrieve the second data block from the additional memory bank.

17. The memory device of claim 9, wherein each memory bank of the plurality of memory banks includes two ports and is capable of performing two read operations and one write operation concurrently in a given single clock cycle.

18. The memory device of claim 9, wherein each memory bank of the plurality of memory banks is configured to perform at most a single write operation in a clock cycle.

19. The memory device of claim 9, wherein each memory bank of the plurality of memory banks and the additional memory bank each operates at half clock frequency of the memory device.

20. A method of performing memory operations, the method comprising:
receiving a plurality of data blocks to be written to one or more memory banks among a plurality of memory banks including a plurality of primary memory banks and an additional memory bank;
determining whether more than one half of the data blocks in the plurality of data blocks are addressed to a same primary memory bank in the plurality of memory banks;
in response to determining that not more than one half of the data blocks in the plurality of data blocks are addressed to the same primary memory bank, writing, in a single clock cycle, the plurality of data blocks to appropriate ones of the primary memory banks; and
in response to determining that more than one half of the data blocks in the plurality of data blocks are addressed to the same primary memory bank,
(i) writing to the same primary memory bank, in the single clock cycle, a subset of the data blocks addressed to the same primary memory bank, wherein a number of data blocks in the subset is not more than one half of the data blocks in the plurality of data blocks,
(ii) writing to the additional primary memory bank, in the single clock cycle, one or more remaining data blocks of the data blocks addressed to the same primary memory bank, and
(iii) writing to one or more other primary memory banks, in the single clock cycle, data blocks in the plurality of data blocks not addressed to the same primary memory bank.

21. The method of claim 20, further comprising:
updating information associated with the subset of data blocks stored in the same primary memory bank, to indicate that each data block in the subset of data blocks is stored in the same primary memory bank and not in the additional memory bank, and
updating information associated with the one or more remaining data blocks stored in the additional memory bank, to indicate that each data block in the one or more remaining data blocks is stored in the additional memory bank and not in the same primary memory bank.

22. The method of claim 20, further comprising:
retrieving one or more previously stored data blocks in the additional memory bank at one or more memory locations of the additional memory at which data blocks in the one or more remaining data blocks are to be stored; and
writing the one or more previously stored data blocks to one or more other primary memory banks in the plurality of memory banks.

23. The method of claim 20, wherein writing the subset of the data blocks to the same primary memory bank in the single clock cycle comprises writing via a number of one or more write ports of the same primary memory bank, wherein the number of one or more write ports is at most one half of a number of data blocks in the plurality of data blocks.

24. A memory device comprising:
a plurality of memory banks for storing data, including a plurality of primary memory banks and one or more additional memory banks;
a plurality of ports configured to receive respective data blocks in a plurality of data blocks; and
a memory controller coupled to the plurality of ports, the memory controller configured to:
receive, via the plurality of ports, the plurality of data blocks to be written to one or more memory banks among a plurality of memory banks,
determine whether more than one half of the data blocks in the plurality of data blocks are addressed to a same primary memory bank in the plurality of memory banks,
in response to determining that not more than one half of the data blocks in the plurality of data blocks are addressed to the same primary memory bank, write, in a single clock cycle, the plurality of data blocks to appropriate ones of the primary memory banks, and
in response to determining that more than one half of the data blocks in the plurality of data blocks are addressed to the same primary memory bank,
(i) write to the same primary memory bank, in the single clock cycle, a subset of the data blocks addressed to the same primary memory bank, wherein a number of data blocks in the subset is not more than one half of the data blocks in the plurality of data blocks,
(ii) write to the additional primary memory bank, in the single clock cycle, one or more remaining data blocks of the data blocks addressed to the same primary memory bank, and
(iii) write to one or more other primary memory banks, in the single clock cycle, data blocks in the plurality of data blocks not addressed to the same primary memory bank.

25. The memory device of claim 24, wherein the memory controller is configured to:

update information associated with the subset of data blocks stored in the same primary memory bank, to indicate that each data block in the subset of data blocks is stored in the same primary memory bank and not in the additional memory bank, and update information associated with the one or more remaining data blocks stored in the additional memory bank, to indicate that each data block in the one or more remaining data blocks is stored in the additional memory bank and not in the same primary memory bank.

26. The memory device of claim 24, wherein the memory controller is configured to:

retrieve one or more previously stored data blocks in the additional memory bank at one or more memory locations of the additional memory at which data blocks in the one or more remaining data blocks are to be stored, and write the one or more previously stored data blocks to one or more other primary memory banks in the plurality of memory banks.

27. The memory device of claim 24, wherein each memory bank in the plurality of memory banks supports at most a number of concurrent write operations in the single clock cycle, wherein the number of concurrent write operations is at most one half of a number of data blocks in the plurality of data blocks.

28. The memory device of claim 27, wherein each memory bank in the plurality of memory banks supports at most a number of concurrent read operations in the single clock cycle, wherein the number of concurrent read operations is at least the number of data blocks in the plurality of data blocks.

* * * * *